Nov. 30, 1965 S. VITKOVITS, JR 3,221,266
LINEAR SWEEP FREQUENCY GENERATOR
Filed March 3, 1964
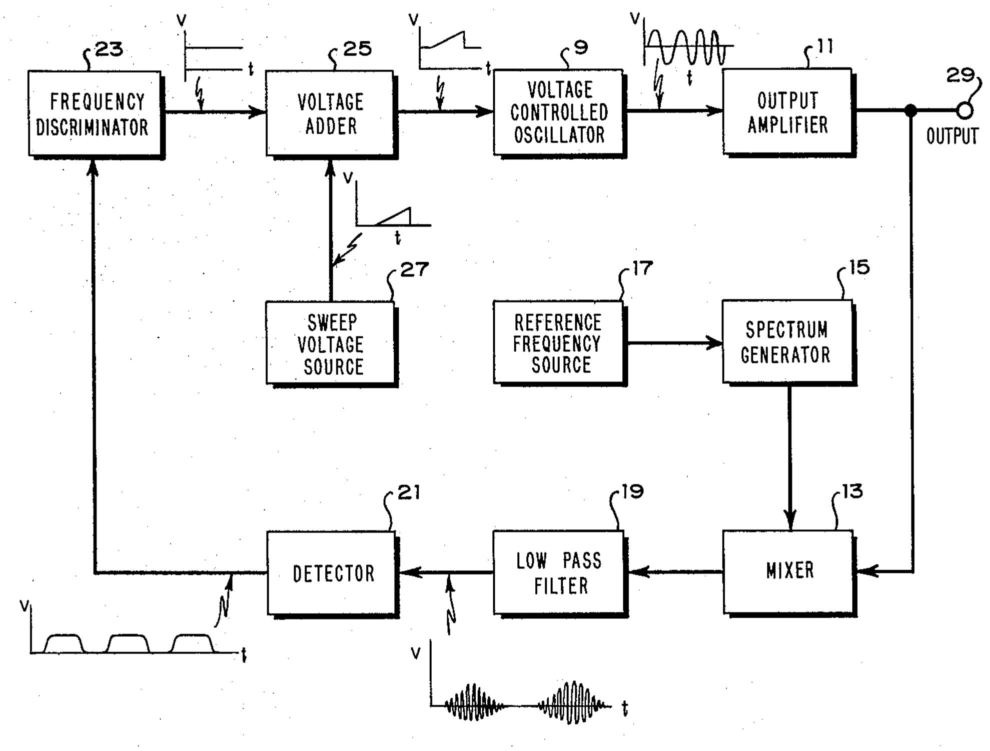
INVENTOR
STEPHEN VITKOVITS, JR.
BY Q. C. Smith
ATTORNEY United States Patent Office 3,221,266
Patented Nov. 30, 1965

3,221,266

LINEAR SWEEP FREQUENCY GENERATOR

Stephen Vitkovits, Jr., Gillette, N.J., assignor to Hewlett-Packard Company, Palo Alto, Calif., a corporation of California Filed Mar. 3, 1964, Ser. No. 348,964
4 Claims. (Cl. 331—19)

This invention relates to sweep frequency apparatus which produces an output frequency that varies at a linear rate with time.

It is an object of the present invention to provide a circuit which detects non-linearities in the rate of change of frequency with time at the output of a voltage-tuned signal source.

It is another object of the present invention to provide a circuit which linearizes the sweep rate of a sweep frequency signal source.

In accordance with the illustrated embodiment of the present invention, the output of a sweep frequency generator is compared with successive harmonics of a reference signal. Beat frequency signals occurring within a low frequency pass band are periodically produced as the sweep frequency passes through successive harmonics of the reference signal. Variations in the periodic occurrences of these beat signals are detected and converted to an error signal which corrects nonlinearities in the rate of change of the sweep frequency.

Other and incidental objects of the present invention will be apparent from a reading of this specification and an inspection of the accompanying drawing which shows a block diagram of the circuit of the present invention.

Referring to the drawing, there is shown a voltage-controlled oscillator 9 which produces a time-varying signal frequency. This signal frequency is amplified by amplifier 11 and is applied to an input of mixer 13. The spectrum (or harmonic) generator 15 receives the output of the reference frequency source 17 and produces therefrom a plurality of harmonic frequencies within the band of frequencies covered by oscillator 9, which harmonics are applied to the other input of mixer 13. The output of mixer 13 is a beat frequency which decreases from a high value toward zero beat and then increases toward a high value each time the signal frequency from oscillator 9 passes through a harmonic of the reference source 17. These beat frequency signals are filtered by low pass filter 19 to reject the high frequencies and to pass only the low beat frequencies about zero. These low beat frequencies are applied to detector 21 which produces an output signal with time which shows a peak each time the output of mixer passes through zero beat. These recurring peak signals are applied to frequency discriminator 23 which produces an output voltage related to the repetition rate of the recurring peak signals from detector 21. This output voltage is combined in adder 25 with the saw-tooth tuning voltage from source 27 to produce a frequency-controlling voltage which when applied to oscillator 9 maintains the time-rate of change of output frequency substantially constant. The frequency of signal at output 29 thus changes at a linear rate, independent of the particular voltage-frequency tuning characteristic of the oscillator 9.

I claim:

1. Signalling apparatus comprising:
a first source of signal having a frequency related to a voltage applied to said source;
a source of sweep voltage continuously coupled to said first source for varying the frequency of the signal from said first source;
a second source of signal having a plurality of evenly-spaced frequency components within its frequency spectrum;
mixing means coupled to said first and second sources for mixing signals from said sources thereby to produce recurring beat frequency signals;
correcting means responsive to the repetition rate of only one of said beat frequency signals for generating a correction voltage signal; and
additional means coupled to said first source and to said correcting means for modifying said sweep voltage in accordance with said correction voltage, whereby the rate of change of frequency of the signal from said first source is maintained substantially constant with time.

2. Signalling apparatus comprising:
a first source of signal having a frequency related to a voltage applied to said source;
a source of sweep voltage continuously coupled to said first source for periodically varying the frequency of the signal from said first source;
a second source of signal having a plurality of evenly-spaced frequency components within its frequency spectrum;
mixing means coupled to said first and second sources for mixing signals from said sources thereby to produce recurring beat frequency signals; and
low pass filter means, detecting means, and discriminating means serially connected from said mixing means to said first source for providing a correction voltage signal related to the repetition rate of only the lower frequency components of said beat frequency signals, whereby the rate of change of frequency of the signal from said first source is maintained constant.

3. Signalling apparatus comprising:
a first source of signal having a frequency related to a voltage applied to said source;
a source of sweep voltage continuously coupled to said first source for varying the frequency of the signal from said first source;
a second source of signal having a plurality of evenly-spaced frequency components within its frequency spectrum;
mixing means coupled to said first and second sources for mixing signals from said sources thereby to produce recurring beat frequency signals;
low pass filter means coupled to said mixing means for transmitting an envelope of only the lower ones of said beat frequency signals;
detecting means coupled to said filter means for producing a signal related to the recurrence rate of said lower beat frequency signals;
discriminating means coupled to said detecting means for producing a correction voltage signal; and
additional means coupled to said first source and to said discriminating means for modifying said sweep voltage in accordance with said correction voltage signal, whereby the rate of change of frequency of the signal from said first source is maintained substantially constant with time.

4. Signalling apparatus set forth in claim 3 whereby said second source includes a reference frequency signal source and means connected to receive said reference frequency for producing a signal including a plurality of successive harmonics of said reference frequency.

References Cited by the Examiner

UNITED STATES PATENTS

| | | | |
|---|---|---|---|
| 3,076,151 | 1/1963 | Swanson | 331—19 |
| 3,155,919 | 11/1964 | Baxter et al. | 331—19 |

NATHAN KAUFMAN, *Primary Examiner.*

JOHN KOMINSKI, *Examiner.*